US005528638A

United States Patent [19]

Rajivan

[11] Patent Number: 5,528,638
[45] Date of Patent: Jun. 18, 1996

[54] MULTIPLE PHASE SHIFTED CLOCKS GENERATION USING A MINIMAL SET OF SIGNALS FROM A PLL

[75] Inventor: Sathyanandan Rajivan, San Jose, Calif.

[73] Assignee: Sun Microsystems, Inc., Mountain View, Calif.

[21] Appl. No.: 449,355

[22] Filed: May 24, 1995

[51] Int. Cl.[6] .................................................. H03D 3/24
[52] U.S. Cl. ............................. 375/376; 375/374
[58] Field of Search ................................ 375/373, 374, 375/375, 376; 331/1 R, 1 A, 10, 11, 12, 25; 327/156, 157, 158, 159, 161, 162, 141, 144

[56] References Cited

U.S. PATENT DOCUMENTS

4,926,447  5/1990  Corsetto et al. ..................... 375/376
5,119,045  6/1992  Sato ..................................... 375/238
5,122,679  6/1992  Ishii et al. ........................... 327/141

Primary Examiner—Stephen Chin
Assistant Examiner—Huong Luu
Attorney, Agent, or Firm—Hickman Beyer & Weaver

[57] ABSTRACT

An inventive apparatus for generating a plurality of phase-shifted clocks on an IC, including a PLL disposed at a first location for generating a reference clock and a reference voltage, local clock generation circuit disposed at a second location, and a first conductor coupling to both the PLL and the local clock generation circuit for furnishing the reference clock from the PLL to the local clock generation circuit. The inventive apparatus further includes a second conductor coupling to both the PLL and the local clock generation circuit for furnishing the reference voltage from the PLL to the local clock generation circuit; wherein the plurality of phase-shifted clocks are generated at the second location, responsive to the reference voltage and the reference clock, using the local clock generation circuit.

18 Claims, 8 Drawing Sheets

MULTIPLE PHASE SHIFTED CLOCKS GENERATION USING A MINIMAL SET OF SIGNALS FROM A PLL

BACKGROUND OF THE INVENTION

The present invention relates to digital circuits, particularly circuits for generating a plurality of phase shifted clocks from a phase locked loop circuit (PLL). In particular, the present invention relates to methods and apparatuses for generating phase shifted clocks at various local sites on an integrated circuit (IC) chip from a minimal set of signals from a central PLL.

Recent advances in miniaturization and fabrication techniques permit circuit designers to create a PLL circuit directly on board the chip on which logic circuitry, say a microprocessor, is implemented. The availability of an onboard PLL circuit facilitates logic designs which advantageously utilize one or more phase shifted clocks. Phase shifted clocks are clocks that have essentially the same frequency relative to one another and are delayed, or phase shifted, from one another in a frequency-dependent manner. Phase shifted clocks advantageously simplify the design and improve the performance of certain types of logic circuits, such as dynamic CMOS logic circuits or positive feedback amplifiers, in which the relative timing between clocks as well as circuit cycles are important at any operating frequency. For further information regarding phase-shifted clocks in general, reference may be made to the commonly-assigned, co-pending patent application Ser. No. 08/448,886 entitled "Rubberband Logic" (Attorney Docket No. P710/SUN1P017) and filed on May 24, 1995, which application is incorporated herein by reference for all purposes.

In the prior art, multiple phase shifted clocks are generated at a centrally located PLL and are then bussed across the chip via separate conductors to the local sites where they are used. It has been subsequently discovered, however, that the use of multiple conductors to bring the centrally generated phase shifted clocks to the local sites where they are needed has many disadvantages.

Figure 1:
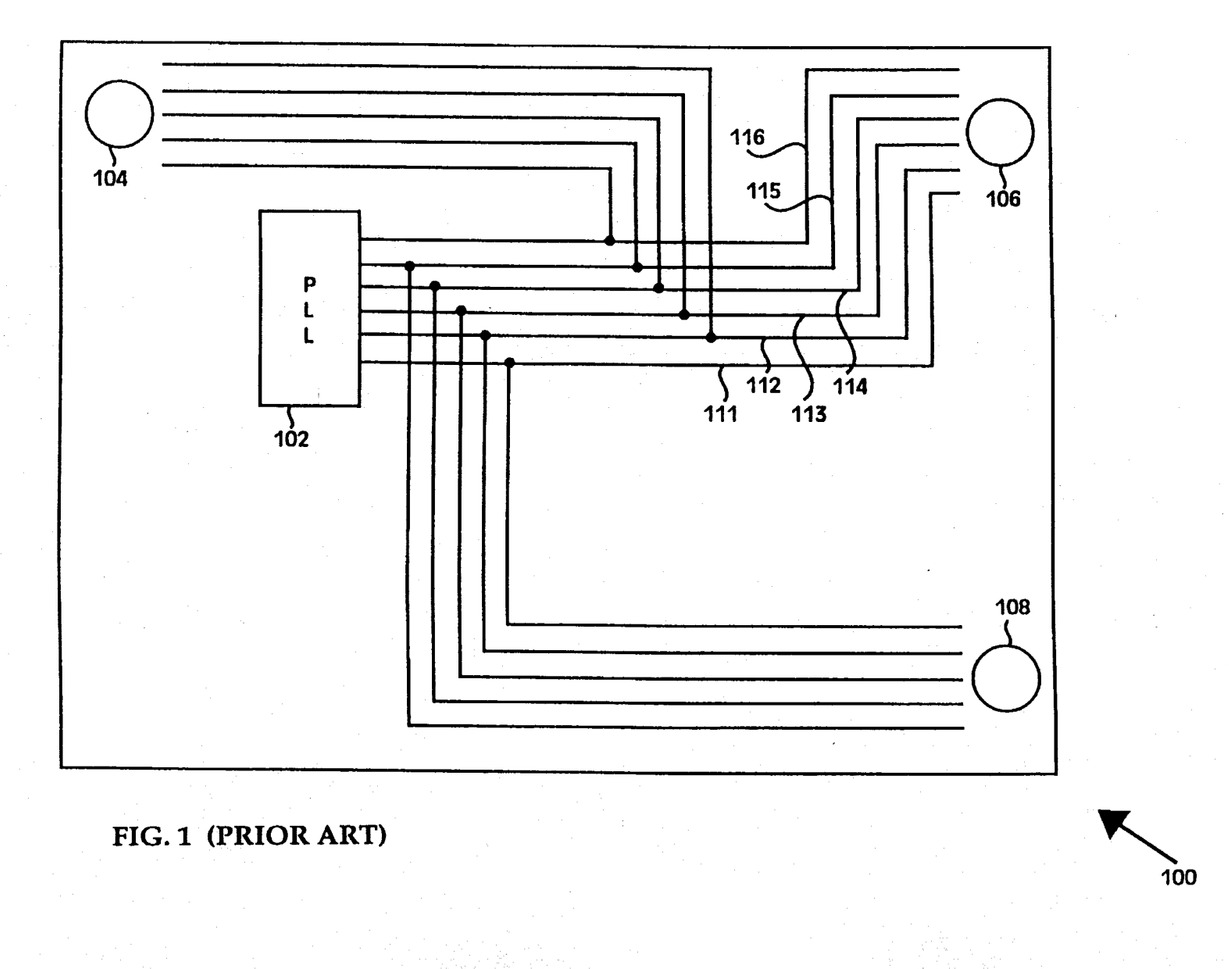
FIG. 1 shows in a simplified format a prior art PLL circuit for generating a plurality of phase shifted clocks, including the conductors necessary to bus the centrally generated phase shifted clocks across chip.

FIG. 1 shows in a simplified format a prior art PLL circuit for centrally generating a plurality of phase shifted clocks, including the conductors necessary to bus the centrally generated phase shifted clocks across chip. Referring now to FIG. 1, there is shown an integrated circuit (IC) chip 100, having a centrally located PLL 102. As the term is used herein, a PLL is considered to be centrally located if the circuit that performs the function associated with the PLL is centralized at a single location on chip, regardless whether that location is at the chip center or near the chip's periphery. Centrally located PLL 102 generates a plurality of phase shifted clocks and buses some or all phase shifted clocks to each of the three local sites, i.e. local sites 104, 106, and 108. For simplicity of illustration, FIG. 1 shows PLL 102 generating six phase shifted clocks which are outputted on six conductors 111–116. All six conductors 111–116 are furnished to local site 106 where they are required. Five of the conductors, 112–116, are brought to local site 104 for local usage. Another five, 111–115, are further brought to local site 108 for use at that location. As is apparent, a large number of conductors are required in the prior art to furnish centrally generated phase shifted clocks to the local sites where they are needed.

When phase shifted clocks are generated centrally, a large number of conductors are required to bus the centrally generated phase shifted clocks to the local sites. The use of a large number of conductors disadvantageously consumes space, i.e. real estate, on chip, often necessitating an increase in chip size to accommodate the aforementioned large number of conductors within existing design rules. The large number of conductors on chip also complicates the layout task and places a limitation on the total number of clocks that can be centrally generated. Because of these limitations, the use of multiple phase shifted clocks in circuit designs has not gained wide acceptance since it is often impractical, due to real estate, layout, and power constraints, to centrally generate more than a few phase shifted clocks and to bus them across chip.

In the prior art method which generates phase shifted clocks centrally and bus them across chip, the presence of long conductors, each carrying a high frequency clock, increases the susceptibility of the resulting design to electromagnetic interferences. Further, the capacitances associated with these long conductors necessitate a higher driving current on the part of the central PLL, thereby increasing power consumption and resulting in the undesirable production of thermal energy that is frequently the cause of premature chips failures.

More significantly, when phase shifted clocks are centrally generated, the addition or deletion of a clock at a local site necessitates changes throughout the chip. For example, when one clock out of say five is no longer needed at a local site in the prior art, the conductor that buses that clock signal from the central PLL to the local site needs to be removed and the layout may need to be reoptimized. If a designer decides in a later stage of a design project to substitute one clock line for another clock line, conductors have to be rerouted in the prior art to furnish the appropriate clock lines to the local site that requires them. Design modularity is therefore adversely impacted, with an attendant increase in design time and costs whenever changes have to be made with respect to one of the centrally generated clocks.

What is needed is improved apparatuses and methods for generating phase shifted clocks at local sites from as few centrally generated PLL signals as possible. The improved apparatuses and methods would simplify the design of the central PLL by preferably generating only a reference clock and a reference signal, from which phase shifted clocks can be locally generated on an as-needed basis. In this manner, the number of conductors radiating from the central PLL may be reduced, thereby lowering the chip's real estate usage, power consumption, and susceptibility to electromagnetic interference.

SUMMARY OF THE INVENTION

The invention relates to an apparatus for generating a plurality of phase-shifted clocks at a local site on an IC chip. The inventive apparatus includes a central PLL for generating a reference clock and a reference voltage, a local clock generation circuit disposed at the local site, and a set of conductors coupling the central PLL to the local clock generation circuit. The set of conductors includes a first conductor for carrying the reference clock and a second conductor for carrying the reference voltage, wherein the plurality of phase-shifted clocks are generated at the local site by the local clock generation circuit using the reference clock and the reference voltage.

In another embodiment, the invention relates to a method for generating a plurality of phase-shifted clocks at a local site on an IC chip, which includes the steps of providing a central PLL for generating a reference clock and a reference voltage, and providing a local clock generation circuit at the local site. The inventive method further includes the step of coupling a set of conductors between the central PLL and the local clock generation circuit, the set of conductors including a first conductor for carrying the reference clock and a second conductor for carrying the reference voltage, wherein the plurality of phase-shifted clocks are generated at the local site by the local clock generation circuit using the reference clock and the reference voltage.

In yet another embodiment, the invention relates to a method for generating a plurality of phase-shifted clocks at a local site on an IC chip, which includes the steps of providing a centrally located PLL on the IC chip, generating, using the centrally located PLL, a reference clock and a reference voltage signal, and providing a local clock generation circuit at the local site. The inventive method further includes the steps of coupling the local clock generation circuit with a first set of conductors, the first set of conductors coupling the centrally located PLL with the local clock generation circuit for furnishing the reference clock and the reference voltage signal from the centrally located PLL to the local clock generation circuit. Further, the inventive method also includes the step of generating locally at the local site, responsive to the reference clock and the reference voltage signal, the plurality of phase-shifted clocks using the local clock generation circuit.

In yet another embodiment, the inventive method relates to an apparatus for generating a plurality of phase-shifted clocks on an IC. The inventive apparatus includes a PLL disposed at a first location for generating a reference clock and a reference voltage, local clock generation circuit disposed at a second location, and a first conductor coupling to both the PLL and the local clock generation circuit for furnishing the reference clock from the PLL to the local clock generation circuit. The inventive apparatus further includes a second conductor coupling to both the PLL and the local clock generation circuit for furnishing the reference voltage from the PLL to the local clock generation circuit; wherein the plurality of phase-shifted clocks are generated at the second location, responsive to the reference voltage and the reference clock, using the local clock generation circuit.

These and other features of the present invention will be presented in more detail in the following specification of the invention, the figures, and the appended claims.

DESCRIPTION OF THE PREFERRED EMBODIMENT

Figure 2:
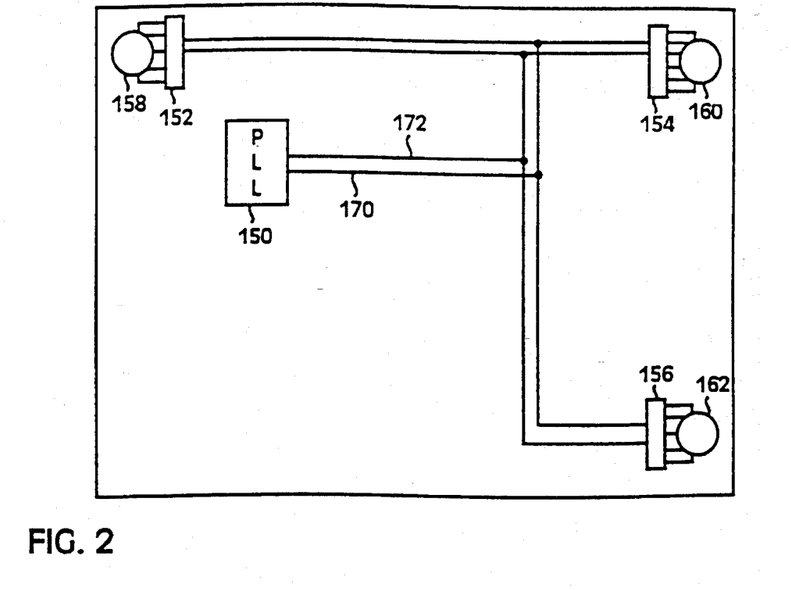
FIG. 2 shows in a simplified format one embodiment of the invention, including the simplified, inventive PLL circuit, and local clock generation circuits associated with local sites on an IC chip.

FIG. 2 shows in a simplified format one embodiment of the invention, including the simplified, inventive PLL circuit 150, and local clock generation circuits 152, 154, and 156 associated with local sites 158, 160, and 162 respectively. Inventive PLL circuit 150 generates a reference voltage 170 and a reference clock 172, which are then bussed to each local site for locally generating the required phase shifted clocks. For example, each of reference voltage 170 and reference clock 172 is furnished to local clock generation circuit 152 to locally generate six phase shifted clocks for use at local site 158. As a further example, reference voltage 170 and reference clock 172 are furnished to local clock generation circuit 154 to locally generate five phase shifted clocks for use at local site 160. Compared to the prior art circuit of FIG. 1, the present invention simplifies the design of the centrally located PLL 150 by reducing the number of signals that must be centrally located. Further, the number of conductors required to couple the central PLL 150 to each local site is reduced, thereby simplifying the layout task as well as localizing changes should a phase shifted clock needs to be added or removed at any one local site.

Figure 3A:
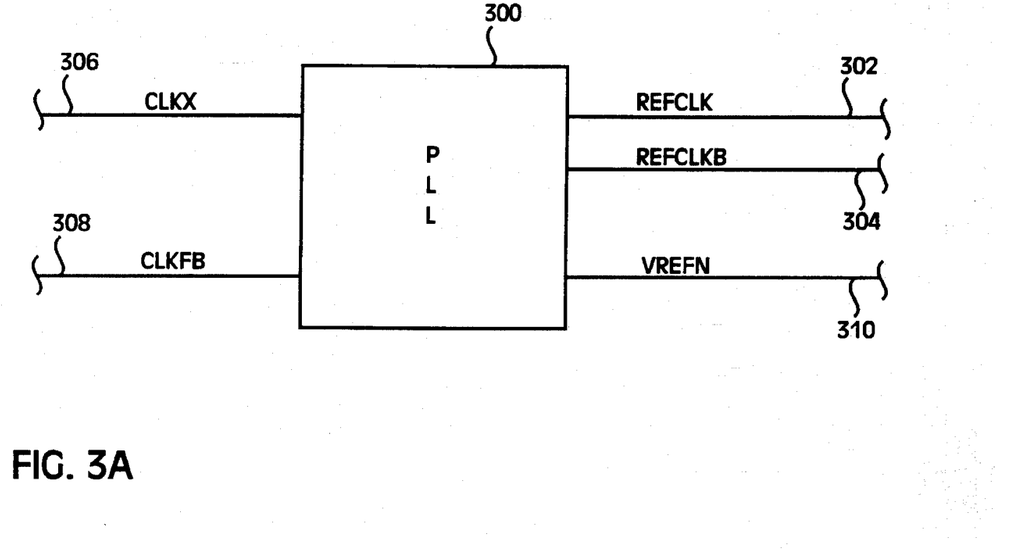
FIG. 3A shows in a simplified circuit diagram format an inventive PLL circuit which is used for generating a reference clock, and optionally its complementary reference clock, responsive to an external reference clock and a feedback clock.

FIG. 3A shows in a simplified circuit diagram format an inventive PLL circuit 300 which is used for generating a reference clock REFCLK on a conductor 302 and optionally its complementary reference clock, REFCLKB, on a conductor 304 responsive to an external reference clock CLKX on a conductor 306 and a feedback clock CLKFB on a conductor 308. PLL 300 is typically designed on chip but may be furnished as a discrete chip as was done in the prior art. PLL 300 locks the frequency and phase of external reference clock CLKX with feedback clock CLKFB. Reference clock REFCLK and optional reference clock REFCLKB represent the true and complement versions of the reference system clock that may be bused to local sites for generating locally phase shifted clocks. PLL circuit 300 further generates a reference voltage signal VREFN on a conductor 310 as shown. Reference voltage signal VREFN, like reference clock REFCLK and optionally reference clock REFCLKB, is then furnished to the local sites on the IC chip and is used at the local sites to locally generate to required phase shifted clocks.

Figure 3B:
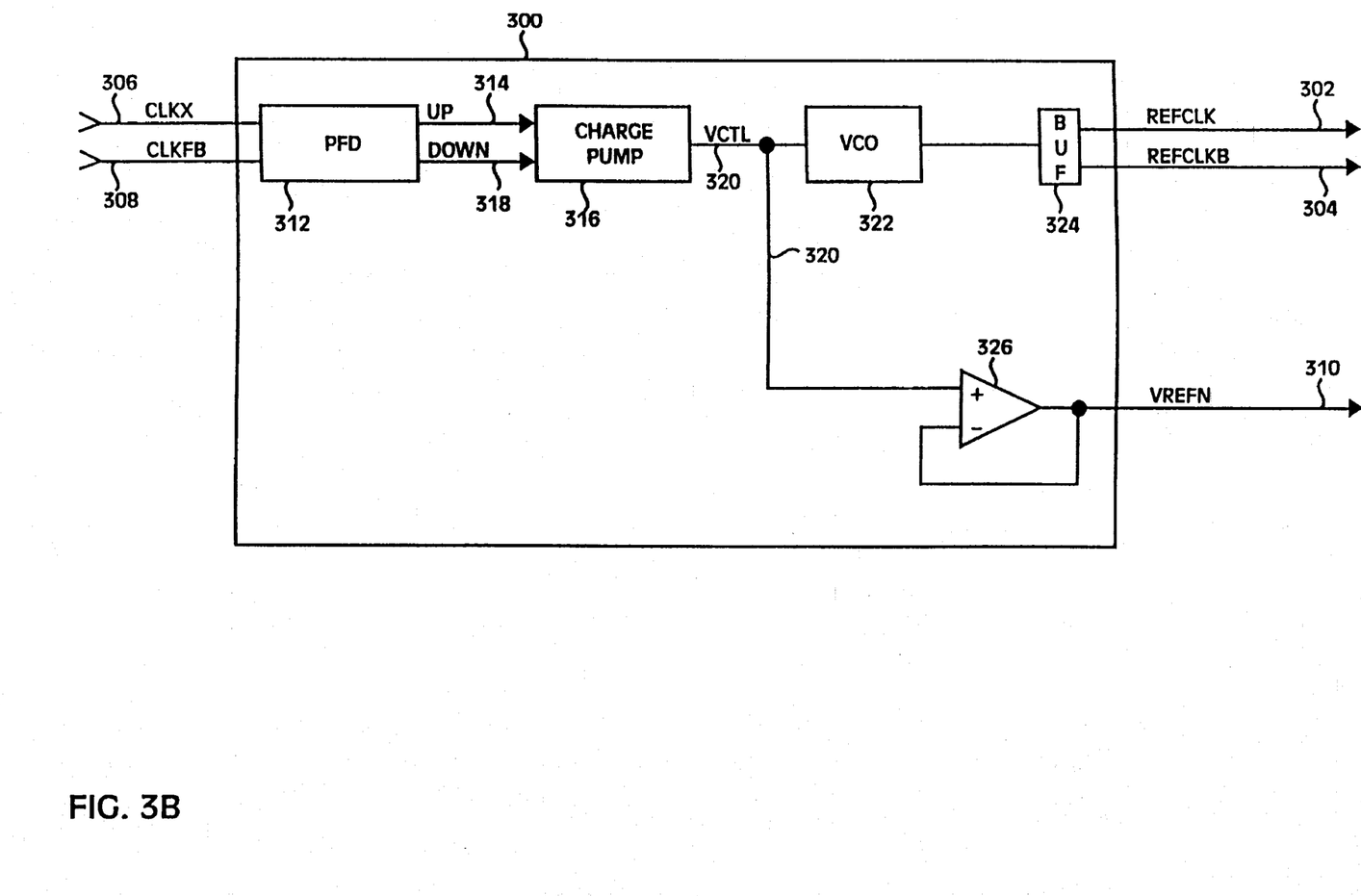
FIG. 3B shows in greater detail the PLL circuit of FIG. 3A.

FIG. 3B shows in greater detail PLL circuit 300 of FIG. 3A. Referring now to FIG. 3B, shown is external reference clock CLKX on a conductor 306. External reference clock CLKX may be generated by, for example, a crystal circuit of the types well known in the art. FIG. 3B also shows a feedback clock CLKFB, which, together with external reference clock CLKX, is inputted into a phase frequency detector 312 of PLL 300. Phase frequency detector 312 then compares the frequency and phase of external clock CLKX with the frequency of feedback clock CLKFB. If external reference clock CLKX is faster than feedback clock CLKFB, phase frequency detector 312 generates an UP signal 314 and outputs UP signal 314 to a charge pump 316 of PLL 300. On the other hand, if external reference clock signal CLKX is slower than feedback clock CLKFB, phase frequency detector 312 generates a DOWN signal 318 and outputs the DOWN signal 318 to charge pump 316.

Charge pump 316 receives either UP signal 314 or DOWN signal 318 and outputs in response thereto a control voltage VCTL on a conductor 320. Control voltage VCTL goes higher if charge pump 316 receives UP signal 314. Conversely, control voltage VCTL goes lower if charge pump 316 receives DOWN signal 318. Control voltage VCTL is then inputted into a voltage controlled oscillator 322 of PLL 300. VCO 322 may be implemented by any number of known voltage controlled oscillators. For further information regarding one implementation of VCO 322, reference may be made to the aforementioned commonly-assigned, co-pending patent application entitled "Rubberband Logic" (Attorney Docket No. P710/SUN1P017). The output of voltage controlled oscillator 322 is inputted into a buffer 324 in order to generate a reference clock REFCLK on conductor 302 and optionally a reference clock REFCLKB on conductor 304. In one embodiment, one of the reference clocks REFCLK or REFCLKB or some derivation of either may be coupled to feedback clock CLKFB. Control voltage VCTL from charge pump 316 is also inputted into a unity gain amplifier 326 of PLL 300 to buffer control voltage VCTL and to output reference voltage signal VREFN on conductor 310.

It should be noted that while the PLL circuit of FIG. 3B is shown to generate only one reference voltage signal VREFN, it is possible to generate both reference voltage signal VREFN and complementary reference voltage signal VREFP centrally through an appropriate buffer associated with PLL 300 and to bus both to the local sites for generating phase shifted clocks. Further, although it is possible to generate both reference clocks REFCLK and REFCLKB centrally by PLL 300 and bus those reference clocks to the local sites, it is also possible to generate only one reference clock, e.g. either reference clock REFCLK or REFCLKB, and bring that reference clock signal to local sites where the complementary clock, if required, may be generated locally using a clock generation method that preferably does not introduce delay into the generated clock signal.

In one embodiment, a frequency divider may be provided with the PLL, e.g. PLL 300 of FIG. 3B, typically but not necessarily between VCO 322 and buffer/driver 324 to get 50% duty cycle on the system clock. In this case, more phases may be provided for a given number of stages, advantageously resulting in improved granularity.

Figure 3C:
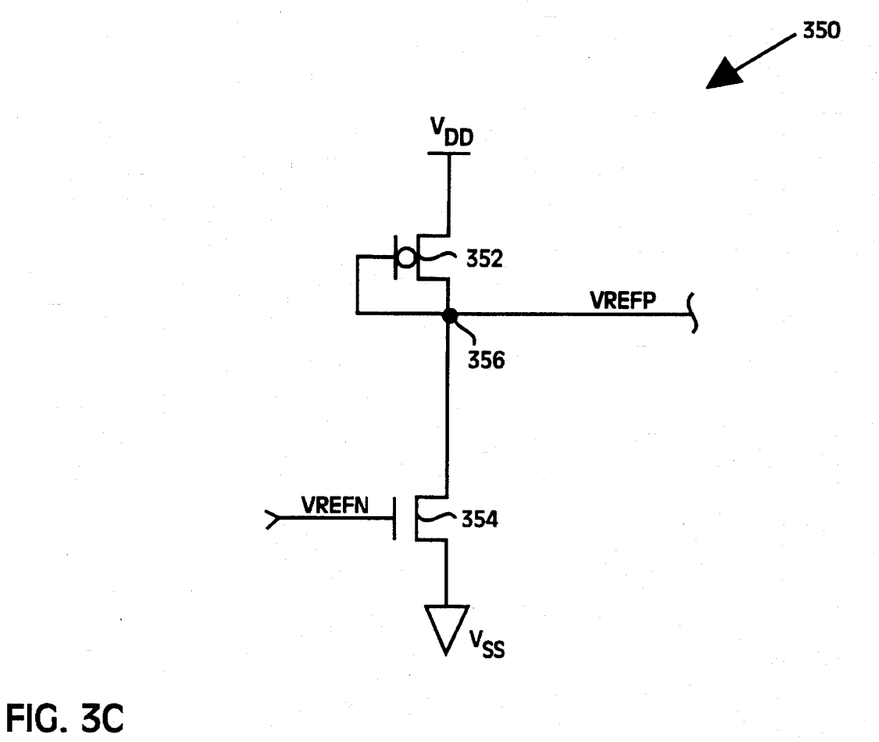
FIG. 3C shows in a simplified circuit diagram format a complementary voltage generation circuit for generating a complementary voltage signal at its output from a furnished voltage signal at its input.

If only one reference voltage signal, e.g. VREFN, is brought to the local sites from the central PLL, it is then necessary to generate the complementary reference voltage signal, e.g. VREFP, at or proximate to the local sites. FIG. 3C shows in a simplified circuit diagram format a complementary voltage generation circuit for generating a complementary voltage signal at its output from a furnished voltage signal at its input. For simplicity of illustration, a simple inverting amplifier 350, preferably disposed at or proximate to a local site where phase shifted clocks are generated is shown in FIG. 3C. Simple inverting amplifier 350 may be thought of as a circuit that creates a mirror image of the input signal at its output.

Referring now to FIG. 3C, there is shown a p-channel device 352 coupled in series with an n-channel device 354, supply voltage $V_{dd}$, and $V_{ss}$. The gate of p-channel device 352 is coupled to a node 356, which node is also coupled to p-channel device 352 and n-channel device 354. Node 356 represents the circuit node from which complementary reference voltage signal VREFP is obtained. On the other hand, the gate of n-channel device 354 is controlled by reference voltage signal VREFN, which is furnished by the central PLL, e.g. PLL 300 of FIG. 3B.

In operation, when reference voltage signal VREFN goes high, n-channel device 354 gets turned on and node 356 is pulled toward $V_{ss}$, thereby causing complementary reference voltage signal VREFP to go low. Conversely, when reference voltage signal VREFN goes low, n-channel device 354 is gradually turned off, causing node 356 (complementary reference voltage VREFP) to go high. As is apparent, reference voltage signal VREFP is a mirror image of reference voltage signal VREFN. P-channel device 352 acts as a current source in the circuit of FIG. 3C.

It should be noted that the circuit of FIG. 3C represents only one embodiment of a complementary voltage generation circuit, i.e. a circuit that locally generates complementary locally reference voltage signal VREFP from furnished reference voltage signal VREFN. As is well known to those of skill in the art, a complementary voltage may be generated from a supplied voltage using other types of circuits well known in the art. In one embodiment, if reference voltage signal VREFN is transmitted over a long conductor, it is typically coupled to the supply, e.g. $V_{ss}$, in order to eliminate transient noises on the VREFN conductor line or Vss line.

Figure 3D:
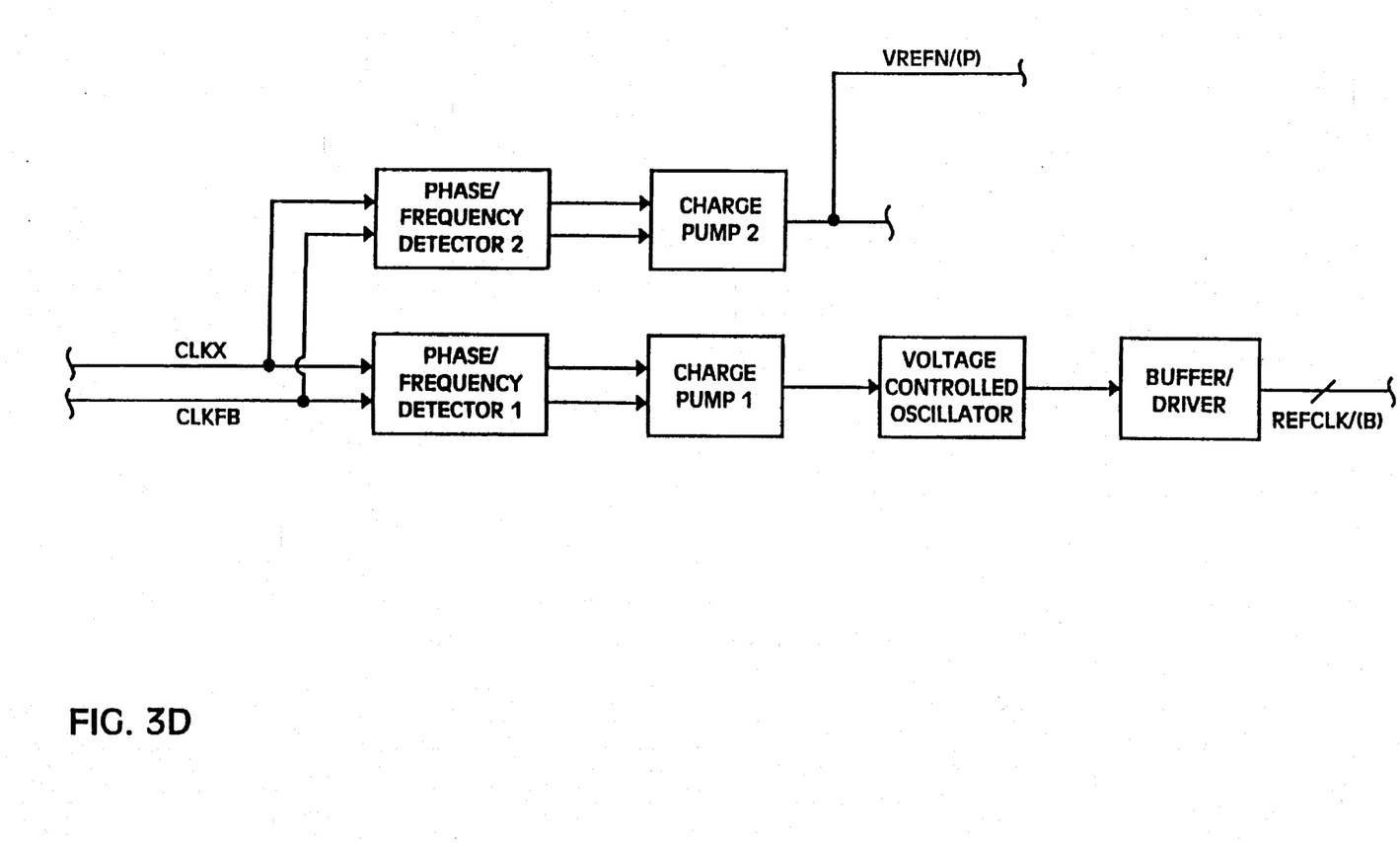
FIG. 3D shows in a simplified format a circuit that advantageously decouples the circuit which provides the reference voltage signal from that which provides the reference clock.

In some cases, it may be advantageous to decouple the circuit that provides the reference voltage signal, e.g. VREFN and/or VREFP, from that which provides the reference clock, e.g. reference clock REFCLK and/or reference clock REFCLKB. The decoupling of the two sets of circuits advantageously reduces interference that may, in some instances, adversely affects the reference clock output. FIG. 3D shows in a simplified format a circuit that advantageously decouples the circuit which provides the reference voltage signal from that which provides the reference clock.

In contrast to the circuit of FIG. 3B, two phase frequency detectors are provided in the circuit of FIG. 3D instead of one. Both frequency dectetors, however, are coupled to the same set of external reference clock and feedback clock. One phase frequency detector is used for generating the reference voltage while the other is used for generating the reference clock. Further, the circuit of the circuit of FIG. 3D provides two charge pump circuits, one of which is used for generating the reference voltage while the other is used for generating the reference clock. The circuit that generates the reference clock further includes the aforementioned voltage controlled oscillator and optional buffer/driver. However, the reference voltage may be directly derived from the output of its charge pump circuit, with or without the use of a buffer circuit.

Figure 4:
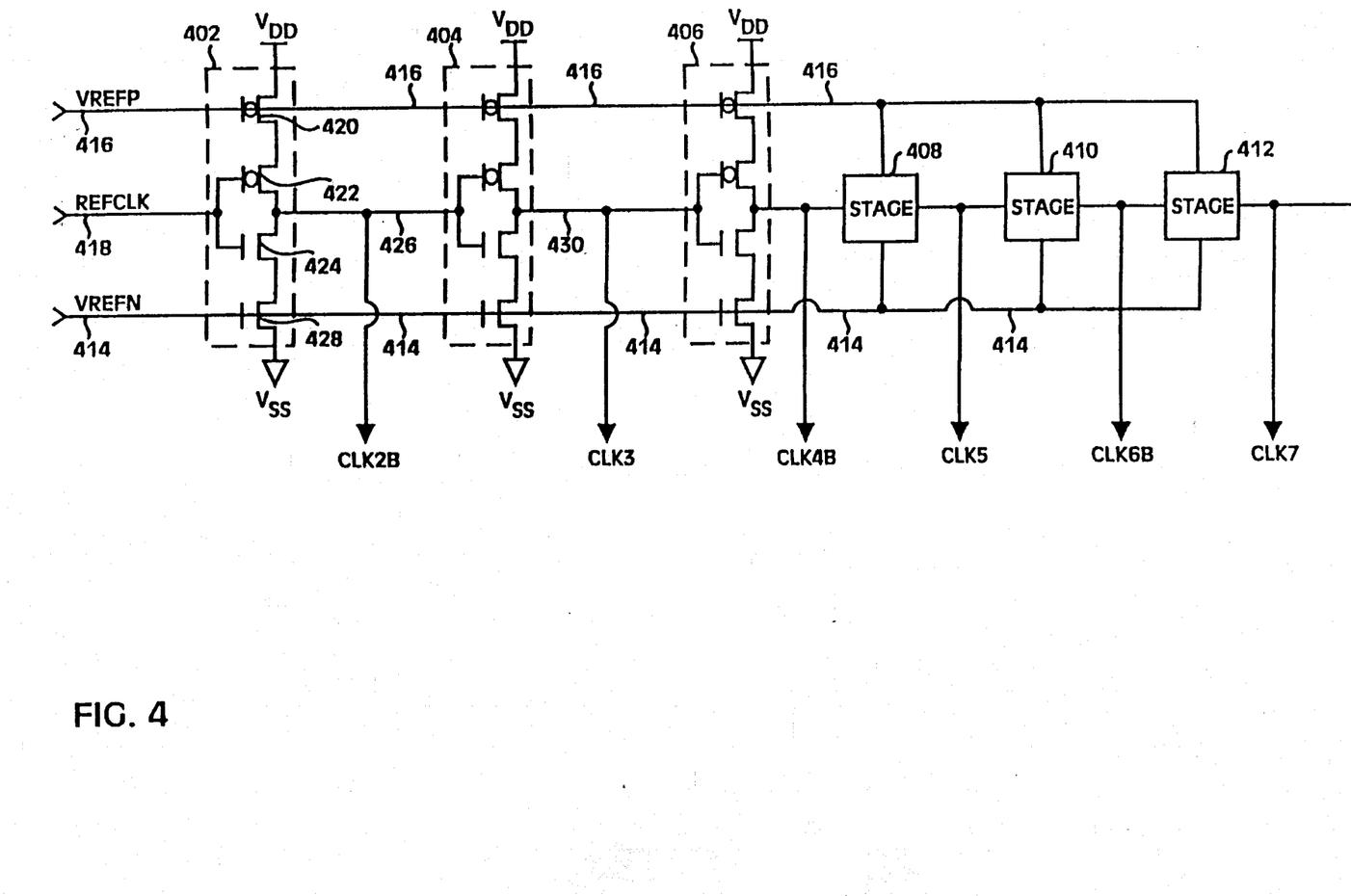
FIG. 4 shows in simplified circuit diagram format a local clock generation circuit used to generate multiple phase shifted clocks at a local site.

FIG. 4 shows in simplified circuit diagram format a local clock generation circuit used to generate multiple phase shifted clocks at a local site. Referring now to FIG. 4, there is shown an open loop phase shifted clock generation circuit 400 comprising six adjustable delay stages 402, 404, 406, 408, 410, and 412. Only the first three delay stages 402, 404, and 406 are fully shown. Stages 408, 410, and 412, which are similar to stages 402, 404, and 406 in construction, are shown in their simplified form for ease of illustration. Further, although six adjustable delay stages are shown in the circuit of FIG. 4 for simplicity of illustration, it should be keep in mind that a greater or few number of stages may be available per phase shifted clock generation circuit depending on need. Phase shifted clock generation circuit 400 receives as it inputs reference voltage signals VREFN and VREFP on conductors 414 and 416 respectively. Phase shifted clock generation circuit 400 also receives, as an input, reference clock REFCLK on a conductor 418.

Adjustable delay stage 402 includes a p-channel device 420 having a gate coupled to reference voltage signal VREFP on conductor 416. P-channel device 420 is also coupled to $V_{dd}$ and a p-channel device 422. The gates of p-channel device 422 and n-channel device 424 are coupled to reference clock REFCLK on conductor 418 as shown in FIG. 4. Both p-channel device 422 and n-channel 424 are coupled to a conductor 426, forming the output for adjustable delay stage 402. N-channel device 424 is coupled in series with an n-channel device 428, whose gate is coupled to reference voltage signal VREFN on conductor 414. N-channel device 428 is further coupled to $V_{ss}$. In this manner, adjustable delay stage 402 is made up of four serially connected devices: a p-channel device 420 whose gate is controlled by reference voltage signal VREFP, an inverter comprising p-channel device 422 and n-channel device 424 whose inputs are controlled by reference clock REFCLK and whose output represents the output of adjustable delay stage 402, and n-channel device 428 whose gate is controlled by reference voltage signal VREFN. Subsequent adjustable delay stages 404, 406, 408, 410, and 412 are similarly constructed. However, their p-channel and n-channel devices may differ in size from the p-channel and n-channel devices that make up adjustable delay stage 402 in order to increase or decrease the delay between the adjustable delay stage output and its input. For example, if finer granularity is required, fan out associated with a given stage could be decreased. On the other hand, if coarser granularity is suitable, fan out may be increased.

In operation, adjustable delay stage 402 receives reference clock REFCLK on conductor 418 from the central PLL, e.g., PLL 300 of FIG. 3B, and outputs on conductor 426 a phase shifted version of the received reference clock. The delay between the output clock on conductor 426 and the input clock on conductor 418 of adjustable delay stage of 402 depends on the magnitude of reference voltage signal VREFN and its dual reference voltage signal, VREFP. When the magnitude of reference voltage signal VREFP increases, the magnitude of its dual reference voltage signal VREFN decreases correspondingly. In this case, less current flows through the devices of adjustable delay stage 402, and the delay between the output signal on conductor 426 relative to the input signal on conductor 418 is increased.

Conversely, when reference voltage signal VREFP decreases in magnitude, its dual reference voltage signal VREFN correspondingly increases. In this case, more current flows through the devices of adjustable delay stage 402 and the delay between the stage output on conductor 426 relative to the input clock on conductor 418 will be lower. The output of adjustable delay stage 402 is fed into a subsequent adjustable delay stage 404 and simultaneously represents a derived phase shifted clock CLK2B. Due to the inverting action of the inverter, which is formed by devices 422 and 424, in adjustable delay stage 402, derived phase shifted clock CLK2B is not only delayed, i.e. phase shifted, but is also opposite in phase with respect to inputted reference clock REFCLK on conductor 418.

Similarly, adjustable delay stage 404 receives as an input the derived phase shifted clock CLK2B on conductor 426 and generates a derived phase shifted clock CLK3 on a conductor 430 responsive to reference voltage signals VREFP and VREFN on conductors 416 and 414 respectively. Derived phase shifted clock CLK3 is delayed from the derived phase shifted clock CLK2B via adjustable delay stage 404. Since derived phase shifted clock CLK2B is itself delayed from reference clock REFCLK on conductor 418, it should be apparent that derived phase shifted clock CLK3 is phase shifted from reference clock REFCLK by a greater amount in comparison to derived phase shifted clock CLK2B. Subsequent adjustable delay stages 406, 408, 410, and 412 are used to respectively derive phase shifted clocks CLK4B, CLK5, CLK6B, and CLK7 in the same manner.

As is apparent from the foregoing, an unlimited number of phase shifted clocks may be generated at a local site from three signals from the central PLL: a reference clock such as reference clock REFCLK, a reference voltage signal such as reference voltage signal VREFN, and its dual reference voltage signal such as reference voltage signal VREFP. If, as mentioned previously, a reference voltage signal, e.g. VREFP, can be generated at or proximate to a local site from its PLL-supplied dual reference voltage signal, e.g. VREFN, using a delay-free clock generation method, as few as two signals, e.g. a single reference clock signal and a single reference voltage signal, from the central PLL are required to locally generate phase shifted clocks at local sites. Note that due to the action of the inverter within the delay stages, every other phase shifted clock is opposite in phase to the supplied reference clock. For example, phase shifted clocks CLK2B, CLK4B, and CLK6B are both delayed and opposite in phase relative to input reference clock REFCLK. In some applications, it may be desirable to generate a complete set of phase shifted clocks, e.g. both the inverted and noninverted versions. In that case, it is possible to use two phase shifted clock generation circuits, with one circuit receiving signal REFCLK as the reference clock signal and the other receiving signal REFCLKB as the reference clock signal for generating the aforementioned complete set.

Figure 5:
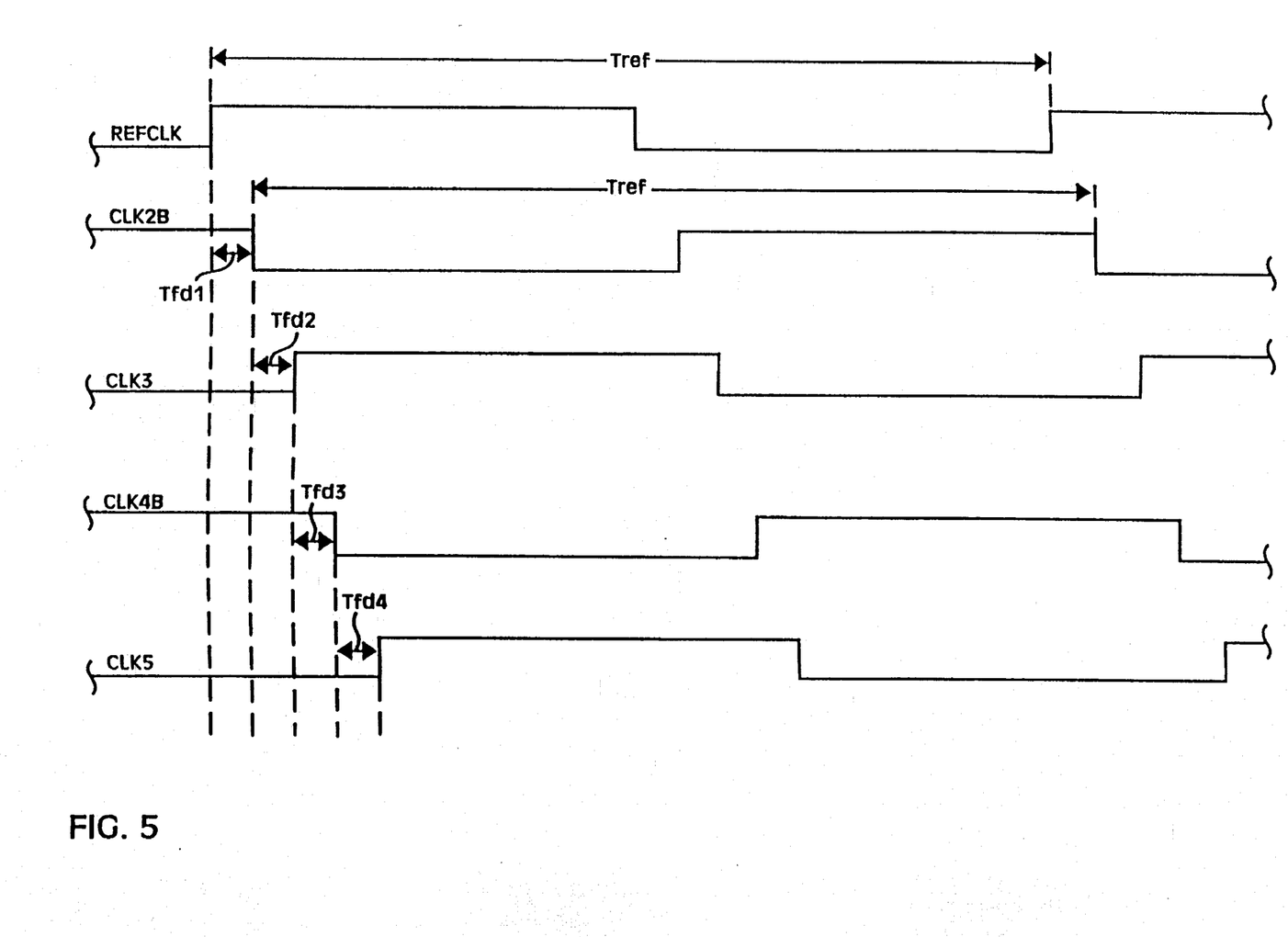
FIG. 5 shows in a simplified timing diagram the relationship between the reference clock and the derived phase shifted clocks of FIG. 4.

FIG. 5 shows in a simplified timing diagram the relationship between reference clock REFCLK of FIG. 4, as well as the derived phase shifted clocks CLK2B, CLK3, CLK4B, and CLK5. Referring now to FIG. 5, there is shown a clock REFCLK representing the input reference clock into phase shifted clock generation circuit 400 of FIG. 4. Reference clock REFCLK has a period Tref as shown. Derived phase shifted clock CLK2B is phase shifted from input clock REFCLK by an adjustable delay amount Tfd1 as shown. Derived phase shifted clock CLK2B has substantially the same period, Tref, as input clock REFCLK. As mentioned previously, derived phase shifted clock CLK2B is not only delayed but also opposite in polarity to input clock REFCLK due to the action of the inverter within adjustable delay stage 402.

Derived phase shifted clock CLK3 is further inverted by adjustable delay stage 404 and has the same polarity as input clock REFCLK due to the action of the inverter in adjustable delay stage 404, albeit delayed with respect to inputted reference clock REFCLK. Derived phase shifted clock CLK3 is delayed from derived phase shifted clock CLK2B by an adjustable delay amount Tfd2. As is apparent, derived phase shifted clock CLK3 is also delayed from input reference clock REFCLK by an adjustable delay amount whose magnitude equals the sum of adjustable delay times Tfd1 and Tfd2.

Similarly, the derived phase shifted clock CLK4B is phase shifted and delayed from derived phase shifted clock CLK3 by an adjustable delay time Tfd3. Derived phase shifted clock CLK5 is further phase shifted and delayed from derived phase shifted clock CLK4B by an adjustable delay Tfd4.

Because the derived phase shifted clocks are delayed from one another by a frequency dependent delay amount, their relative phase differences advantageously remain constant regardless of the operating frequency. Further, the presence of multiple phase shifted clocks at a local site permits a designer to generate a higher frequency clock, i.e. a clock which may have a frequency that is twice, three times, or more, the frequency of the input clock, e.g. reference clock REFCLK. To generate such a clock, multiple appropriately phase shifted clocks may be generated by the disclosed inventive circuit and combined via any logic gates such as an OR circuit or other types of summer circuits such as summing amplifiers. The ability to locally derive clocks having a higher operating frequency from a reference input clock represents another advantage of the present invention.

Figure 6:
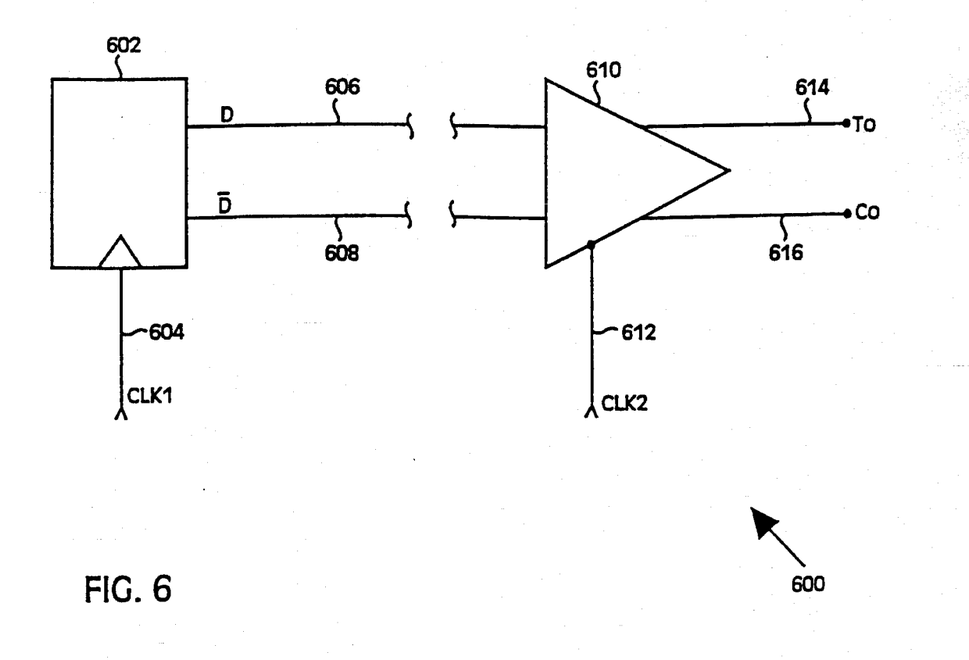
FIG. 6 shows in simplified circuit diagram format a positive feedback amplifier circuit, representing a type of circuit which benefits from the use of multiple phase shifted clocks in its operation.

The use of multiple clocks advantageously eliminates the need for self-timed circuits. By way of example, FIG. 6 shows in simplified circuit diagram format a positive feedback amplifier circuit 600 which may be used in, for example, microprocessor designs. Positive feedback amplifier circuits represent another class of circuits which benefit from the use of multiple phase shifted clocks in their operation. Referring now to FIG. 6, there is shown an element 602 representing a storage element where data is kept prior to being strobed out by a clock CLK1 via a conductor 604. Element 602 may be, for example, a memory array, a latch, a memory cache, or the like. When strobed by clock CLK1, element 602 output its data on conductors 606 and 608 respectively, to a positive feedback amplifier element 610. Positive feedback amplifier 610 is in turn strobed by a clock CLK2 via a conductor 612, and outputs a true output To on a conductor 614 as well as a complement output Co on a conductor 616.

In operation, clock CLK1 strobes element 602, thereby outputting data on conductors 606 and 608 respectively. The data on conductors 606 and 608 are then amplified by positive feedback amplifier 610 responsive to a strobe clock CLK2 on conductor 612 to output amplified signals on conductors 614 and 616 respectively. To guarantee that the output of circuit 600 accurately reflects the data being strobed out from element 602 by CLK1, it is necessary that clock CLK2 be activated after the activation of clock CLK1 and that the minimum delay between the activation of clock CLK1 and CLK2 be observed.

In the prior art, clocks CLK1 and CLK2 are generated from the same clock via a fixed delay element. Consequently, the prior art positive feedback amplifier circuit suffers the disadvantages associated with designs that use fixed delays, e.g., inflexibility with respect to changes in the operating frequency, less aggressive margins between clocks, nonmodularity, and so on. When phase shifted clocks are used to control clocks CLK1 and CLK2, a designer may be able to safely allow for a more aggressive margin between clocks CLK1 and CLK2 as well as set the circuit of FIG. 6 to operate at its maximum frequency initially. If it turns out that the margin initially provided for between phase shifted clocks CLK1 and CLK2 is insufficient, additional margin may be easily provided by reducing the frequency of the operating clock, e.g. external reference clock signal EXTCLK (209) if the circuit of FIG. 4 is used, in order to increase the delay between phase shifted clocks CLK1 and CLK2. Alternatively, when a plurality of phase shifted clocks are generated and available locally, a designer may not need to turn down the external reference clock in order to increase the margin between clocks CLK1 and CLK2. Instead, the designer may elect to continue operating the circuit at the higher operating frequency and simply choose the appropriate phase shifted clock among the available phase shifted clocks for clock CLK2 in order to obtain the necessary margin.

Figure 7:
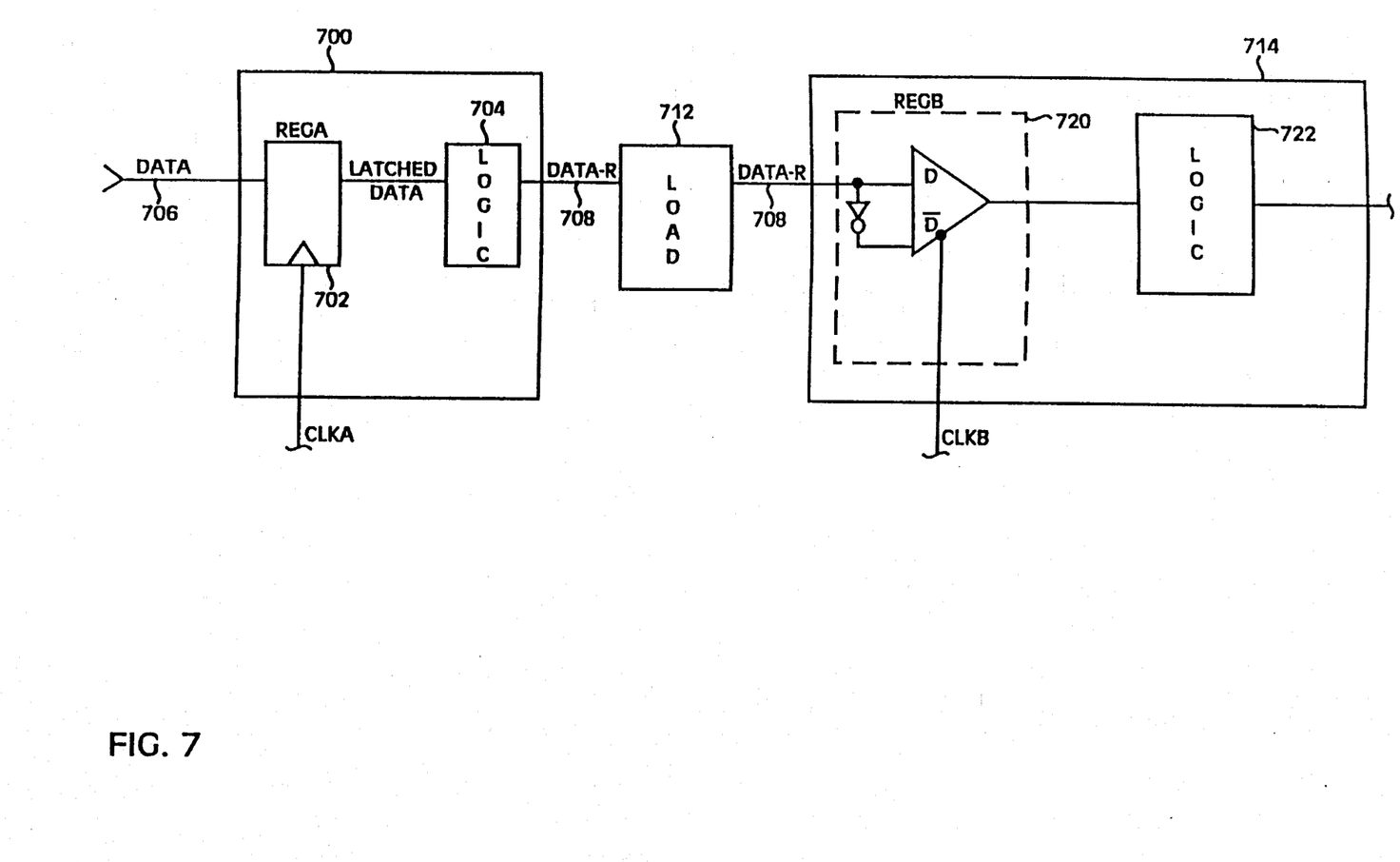
FIG. 7 shows a in a simplified circuit diagram format a circuit that uses two locally generated phase shifted clocks, generated from the same reference clock but at two different local sites, for coordinating transfer and processing of data while minimizing margins between clocks.

FIG. 7 shows a in a simplified circuit diagram format a circuit that uses two locally generated phase shifted clocks, generated from the same reference clock but at two different local sites, for coordinating transfer and processing of data while minimizing margins between clocks. Referring now to FIG. 7, there is shown a first circuit portion 700 which includes an element 702 and a logic portion 704. First circuit portion 700 receives as it input data on a conductor 706 and latches that data using a phase shifted clock CLKA. In one embodiment, element 702 may be a register or a memory which already contains within it data to be strobed out by phase shifted clock CLKA.

The data outputted from element 702 is inputted into logic portion 704. Logic portion 704 represents the circuit for performing logic operations on the latched data and for outputting the data representing the result of the logic operations, DATA-R, on a conductor 708. DATA-R is then bussed across chip over a long conductor, characterized by load 712 in FIG. 7 to be inputted into a second circuit portion 714. It should be appreciated that after DATA-R completes its travel over conductor 708 and suffers the RC delay associated with the long distance traveled, the signal coming in on conductor 708 into second circuit portion 714 may be significantly attenuated. For example, the RC delay associated with load 712 may degrade the transition edges and result in the gradual rise and drop in the slopes of the pulses of signal DATA-R.

Element 720 of second circuit portion 714 represents a circuit which enhances the signal received on conductor 708 and outputs an enhanced signal for subsequent use by a logic circuit 722 of second circuit portion 714. For example, element 720 may output a high whenever the voltage level of signal DATA-R rises above a predefined level and may output a low whenever the voltage level on signal DATA-R falls below a predefined voltage level. A suitable circuit for performing the amplifying task may be a positive feedback amplifier such as that shown in FIG. 7.

In the circuit of FIG. 7, DATA-R on conductor 708 is strobed in by a phase shifted clock CLKB prior to being inputted into logic portion 722 for subsequent processing. As is apparent from the foregoing, the proper operation of the circuit of FIG. 7 requires that clock CLKB be activated after the activation of clock CLKA, preferably following the elapse of an appropriate delay. It should be appreciated that the delay between the activation of clocks CLKB and CLKA must at least be sufficient for the data on conductor 706 to traverse element 702, logic portion 704, and long conductor 708. When phase shifted clocks are used to control element 702 and 720, a designer may, during the initial design phase, safely allow for a more aggressive margin between clocks CLKA and CLKB as well as set the circuit of FIG. 7 to operate at its maximum frequency. If it turns out that load 712 necessitates a greater margin between clocks CLKB and CLKA than originally provided for, the designer may simply reduce the frequency of the inputted reference clock, e.g. external reference clock signal EXTCLK (209) if the circuit of FIG. 4 is used for generating clocks CLKA and CLKB, in order to provide the necessary margin between clocks CLKA and CLKB. Alternatively, when a plurality of phase shifted clocks are generated and available locally, a designer may, as discussed earlier, not need to turn down the external reference clock in order to increase the margin between clocks CLKA and CLKB. Instead, the designer may elect to continue operating the circuit at the higher operating frequency and simply choose the appropriate phase shifted clock among the available phase shifted clocks for clock CLKB in order to obtain the necessary margin.

Although the foregoing invention has been described in some detail for purposes of clarity of understanding, it will be apparent that certain changes and modifications may be practiced within the scope of the appended claims. For example, although the PLL circuit herein as been described in some detail, it should be apparent to those of skill in the art given this disclosure that a PLL circuit may also include other subcircuits such as filters and the like. As a further example, although inverters are used in the voltage controlled oscillator of the present invention in order to generate the appropriate frequency-dependent delays, other types of circuits may be used. Further, although the specific embodiment discusses in detail a a local clock generation circuit for generating multiple phase shifted clocks at a local site, multiple local clock generation circuits, each generating the same or different numbers of phase shifted clocks may be provided at a local site. Specifically, the use of two local clock generation circuits to generate two sets of complementary phase-shifted clocks at a local site is advantageous in certain applications. Consequently, the scope of the invention is not limited to the specific examples given herein but is set forth in the appended claims.

What is claimed is:

1. An apparatus for generating a plurality of phase-shifted clocks at a local site on an integrated circuit (IC) chip, comprising:
   a central phase-locked loop (PLL) for generating a reference clock and a reference voltage;
   a local clock generation circuit disposed at said local site; and
   a set of conductors coupling said central PLL to said local clock generation circuit, said set of conductors comprising a first conductor for carrying said reference clock and a second conductor for carrying said reference voltage, wherein said plurality of phase-shifted clocks are generated at said local site by said local clock generation circuit using said reference clock and said reference voltage.

2. The apparatus of claim 1 wherein said central PLL further generates a complementary reference clock and said set of conductors further comprising a third conductor for carrying said complementary reference clock from said central PLL to said local clock generation circuit.

3. The apparatus of claim 2 further comprising a complementary voltage generation circuit disposed proximate to said local site for generating a complementary reference voltage from said reference voltage.

4. The apparatus of claim 3 wherein said complementary voltage generation circuit comprises an inverting amplifier.

5. The apparatus of claim 2 wherein said central PLL comprises a unity gain amplifier for generating said reference voltage signal.

6. The apparatus of claim 2 wherein said local clock generation circuit comprises a plurality of delay stages, the output of each of said plurality of delay stages represents a phase-shifted clock.

7. The apparatus of claim 6 wherein one of said plurality of delay stages comprises:
   a first p-channel device having a first p-channel device gate controlled by a complementary reference voltage, said complementary reference voltage being the complementary version of said reference voltage;
   an inverter coupled in series to said first p-channel device, said inverter having an inverter input coupled to said reference voltage and an inverter output for outputting a phase-shifted clock; and
   a first n-channel device coupled in series to said inverter, said first n-channel device having a first n-channel device gate controlled by said reference voltage.

8. A method for generating a plurality of phase-shifted clocks at a local site on an integrated circuit (IC) chip, comprising:
   providing a central phase-locked loop (PLL) for generating a reference clock and a reference voltage;
   providing a local clock generation circuit at said local site; and
   coupling a set of conductors between said central PLL and said local clock generation circuit, said set of conductors comprising a first conductor for carrying said reference clock and a second conductor for carrying said reference voltage, wherein said plurality of phase-shifted clocks are generated at said local site by said local clock generation circuit using said reference clock and said reference voltage.

9. The method of claim 8 wherein said step of providing said central PLL further comprising the step of providing a buffer for generating a complementary reference clock and said set of conductors further comprising a third conductor for carrying said complementary reference clock from said central PLL to said local clock generation circuit.

10. The method of claim 9 further comprising:
    providing a complementary voltage generation circuit proximate to said local site for generating a complementary reference voltage from said reference voltage.

11. The method of claim 10 wherein said complementary voltage generation circuit comprises an inverting amplifier.

12. The method of claim 9 wherein said step of providing said central PLL comprises the step of providing a unity gain amplifier for generating said reference voltage signal.

13. The method of claim 9 wherein said step of providing said local clock generation circuit comprises the step of providing a plurality of delay stages, the output of each of said plurality of delay stages represents a phase-shifted clock.

14. The method of claim 13 wherein said step of providing a plurality of delay stages comprises:
    providing a first p-channel device having a first p-channel device gate coupled to a complementary reference voltage, said complementary reference voltage being the complementary version of said reference voltage;
    coupling an inverter in series to said first p-channel device, said inverter having an inverter input coupled to said reference voltage and an inverter output for outputting a phase-shifted clock; and
    coupling a first n-channel device in series to said inverter, said first n-channel device having a first n-channel device gate controlled by said reference voltage.

15. A method for generating a plurality of phase-shifted clock at a local site on an integrated circuit (IC) chip, comprising:

providing a centrally located phase-locked loop (PLL) on said IC chip;

generating, using said centrally located PLL, a reference clock and a reference voltage signal;

providing a local clock generation circuit at said local site;

coupling said local clock generation circuit with a first set of conductors, said first set of conductors coupling said centrally located PLL with said local clock generation circuit for furnishing said reference clock and said reference voltage signal from said centrally located PLL to said local clock generation circuit; and generating locally at said local site, responsive to said reference clock and said reference voltage signal, said plurality of phase-shifted clocks using said local clock generation circuit.

16. The method of claim 15 further comprising:

generating, using a complementary voltage generating circuit, a complementary reference voltage, said complementary reference voltage being substantially a mirror image of said reference voltage; and furnishing said complementary reference voltage to said local clock generation circuit as an input.

17. The method of claim 16 wherein said local clock generation circuit comprises a delay stage for receiving said reference voltage, said complementary reference voltage, and said reference clock as inputs and for outputting a phase-shifted clock, wherein said phase-shifted clock having a frequency that equals a frequency of said reference clock, a delay of said phase-shifted clock relative to said reference clock increases when a magnitude of said reference voltage increases and said delay of said phase-shifted clock relative to said reference clock decreases when said magnitude of said reference voltage decreases.

18. An apparatus for generating a plurality of phase-shifted clocks on an integrated circuit (IC), comprising:

a phase-locked loop disposed at a first location for generating a reference clock, and a reference voltage;

a local clock generation circuit disposed at a second location;

a first conductor coupling to both said PLL and said local clock generation circuit for furnishing said reference clock from said PLL to said local clock generation circuit; and a second conductor coupling to both said PLL and said local clock generation circuit for furnishing said reference voltage from said PLL to said local clock generation circuit; wherein said plurality of phase-shifted clocks are generated at said second location, responsive to said reference voltage and said reference clock, using said local clock generation circuit.

* * * * *

UNITED STATES PATENT AND TRADEMARK OFFICE
CERTIFICATE OF CORRECTION

PATENT NO. : 5,528,638
DATED : June 18, 1996
INVENTOR(S) : S. Rajivan

It is certified that error appears in the above-indentified patent and that said Letters Patent is hereby corrected as shown below:

Column 14, line 11, after "loop", insert -- (PLL) --

Signed and Sealed this

Twenty-sixth Day of November 1996

Attest:

BRUCE LEHMAN

Attesting Officer     Commissioner of Patents and Trademarks